United States Patent
Takano et al.

(10) Patent No.: US 8,120,013 B2
(45) Date of Patent: Feb. 21, 2012

(54) NITRIDE SEMI-CONDUCTOR LIGHT EMITTING DEVICE AND A PROCESS OF PRODUCING A NITRIDE SEMI-CONDUCTOR LIGHT EMITTING DEVICE

(75) Inventors: Takayoshi Takano, Kawanishi (JP); Kenji Tsubaki, Katano (JP); Hideki Hirayama, Asaka (JP); Sachie Fujikawa, Osaka (JP)

(73) Assignees: Panasonic Electric Works Co., Ltd., Osaka (JP); Riken, Saitama (JP)

( * ) Notice: Subject to any disclaimer, the term of this patent is extended or adjusted under 35 U.S.C. 154(b) by 92 days.

(21) Appl. No.: 12/621,364

(22) Filed: Nov. 18, 2009

(65) Prior Publication Data

US 2010/0270532 A1   Oct. 28, 2010

(30) Foreign Application Priority Data

Apr. 22, 2009   (JP) ................. 2009-104407

(51) Int. Cl.
   *H01L 33/00*   (2010.01)
(52) U.S. Cl. .......... 257/14; 257/94; 257/E29.093
(58) Field of Classification Search ............ 257/14, 257/94, E21.097, E29.093, E33.034; 438/604
   See application file for complete search history.

(56) References Cited

U.S. PATENT DOCUMENTS

| 6,229,150 B1* | 5/2001 | Takayama et al. | 257/12 |
| 2002/0190259 A1* | 12/2002 | Goetz et al. | 257/79 |
| 2005/0224781 A1* | 10/2005 | Kneissl et al. | 257/14 |
| 2006/0225643 A1* | 10/2006 | Amano et al. | 117/89 |

FOREIGN PATENT DOCUMENTS

JP   2005-340856 A   12/2005

OTHER PUBLICATIONS

Han et al., "Monitoring and controlling of strain during MOCVD of AlGaN for UV optoelectronics", MRS Internet J. Nitride Semicond. Res. 4S1, G7.7 (1999).*

* cited by examiner

*Primary Examiner* — Thomas L Dickey
(74) *Attorney, Agent, or Firm* — Cheng Law Group, PLLC

(57) ABSTRACT

A nitride semi-conductor light emitting device has a p-type nitride semi-conductor layer 7, an n-type nitride semi-conductor layer 3, and a light emission layer 6 which is interposed between the p-type nitride semi-conductor layer 7 and the n-type nitride semi-conductor layer 3. The light emission layer 6 has a quantum well structure with a barrier layer 6b and a well layer 6a. The barrier layer 6b is formed of $Al_aGa_bIn_{(1-a-b)}N$ ($0<a<1$, $0<b<1$, $1-a-b>0$), and contains a first impurity at a concentration of A greater than zero. The well layer 6a is formed of $Al_cGa_dIn_{(1-c-d)}N$ ($0<c<1$, $c<a$, $0<d<1$, $1-c-d>0$), and contains a second impurity at a concentration of B equal to or greater than zero. In the nitride semi-conductor light emitting device of the present invention, the concentration of A is larger than that of B, in order that the barrier layer 6b has a concentration of oxygen smaller than that in the well layer 6a.

9 Claims, 4 Drawing Sheets

NITRIDE SEMI-CONDUCTOR LIGHT EMITTING DEVICE AND A PROCESS OF PRODUCING A NITRIDE SEMI-CONDUCTOR LIGHT EMITTING DEVICE

TECHNICAL FIELD

This invention relates to a nitride semi-conductor light emitting device including an AlGaInN layer.

BACKGROUND ART

A nitride semi-conductor light emitting device which emits light in UV-visible region is expected to be widely applied, hygienically, medically, industrially, and has been studied to develop an illumination device, a precision machine or the like, for its compact size and its low electrical consumption. The light emitting device which emits light in specific region including blue-color region has already been developed for practical use.

For development of the nitride semi-conductor light emitting device (including that emitting blue light which is referred to as a blue-color light emitting diode), it is necessary to further improve its light emission efficiency and light output. At present, the semi-conductor light emitting device provides much smaller external quantum efficiency and light output in UV region than blue-color region. The very small external quantum efficiency and light output have been obstacles to practical use of the light emitting device in UV region, and are possibly attributed to very low light emission efficiency in light emission layer (referred to as internal quantum efficiency, hereafter).

Due to transition, point defect, and unintended impurity which are formed in large amount in the light emission layer, the nitride semi-conductor (nitride mixed crystal) has very low internal quantum efficiency. Especially, ternary mixed crystal including Al such as AlGaN has considerably low internal quantum efficiency, for difficulty in growth of the mixed crystal with high quality. Instead, a quaternary mixed crystal AlGaInN has been attracted as a mixed crystal which is less affected by the transition and the point defect than AlGaN, for improving the internal quantum efficiency and light intensity.

A UV LED has been proposed for being utilized as a component of the nitride semi-conductor light emitting device. The UV LED is designed to emit light in 280 to 360 nm at room temperature. The UV LED as the light emitting device has a single quantum well structure formed of $Al_aGa_bIn_cN$ ($0.1 \leq a \leq 0.9$, $0.02 \leq c \leq 0.2$, $a+b+c=1$) with different Al components between well and barrier layers which are respectively grown at growth temperature of 830 to 950° C. A UV LED of JP unexamined patent publication 2005-340856 has a buffer layer, an n-type nitride semi-conductor layer, a light emission layer, a p-type nitride semi-conductor layer, which are respectively formed by metal organic vapor phase epitaxy (MOVPE) method. The growth rate of each AlGaInN layer in the light emission layer is set at 0.12 μm/h.

The Al-containing nitride semi-conductor layer is generally grown at a high temperature of 1000° C. or more. For example, growth temperature is generally set at 1150° C. or more for growth of AlN layer, or 1000 to 1200° C. for growth of AlGaN layer.

In the UV LED including AlGaInN layer of JP Unexamined patent publication 2005-340856, the growth temperature needs to be set at 830 to 950° C. below 1000° C. Under such a low temperature, AlGaInN layer tends to entrap thereinto unwanted oxygen which is generated within a reaction chamber made of quartz or originally included in a raw material or a container of the material, compared to AlGaN layer. Besides, Al needs to be added in large amount in growth of AlGaInN layer for achieving light emission in short wavelength, but Al easily entraps the unwanted oxygen. The entrapped oxygen tends to generate defects, to degenerate layers, and to form undesirable energy levels, thereby decreasing the internal quantum yield of light emission layer.

DISCLOSURE OF THE INVENTION

A nitride semi-conductor light emitting device in the present invention has been accomplished in view of the above problem, and intended to improve an internal quantum yield of a light emission layer made of AlGaInN.

The nitride semi-conductor light emitting device has a p-type nitride semi-conductor layer, an n-type nitride semi-conductor layer, and a light emission layer which is interposed between the p-type nitride semi-conductor layer and the n-type nitride semi-conductor layer. The light emission layer has a quantum well structure with a barrier layer and a well layer. The barrier layer is formed of $Al_aGa_bIn_{(1-a-b)}N$ ($0<a<1$, $0<b<1$, $1-a-b>0$), and contains a first impurity at a concentration of A greater than zero. The well layer is formed of $Al_cGa_dIn_{(1-c-d)}N$ ($0<c<1$, $c<a$, $0<d<1$, $1-c-d>0$), and contains a second impurity at a concentration of B equal to or greater than zero. In the nitride semi-conductor light emitting device of the present invention, the concentration of A is larger than that of B, in order that the barrier layer has a concentration of oxygen smaller than that in the well layer.

In the present invention, the barrier layer contains the first impurity at a concentration of A larger than B, enabling to reduce the amount of oxygen combined with aluminum, and thereby improving quality of AlGaInN crystal as the light emission layer, so as to effectively supply the well layer with electrons for achieving a high internal quantum efficiency in the light emission layer.

Preferably, the first and second impurities are Si. The addition of Si enables to reduce the amount of oxygen combined with Al in a chamber of MOPVE apparatus, enabling to reduce a concentration of oxygen trapped into the light emission layer, especially in the barrier layer.

Preferably, the barrier layer contains the first impurity with its concentration of $5 \times 10^{16}$ cm$^{-3}$ or more. The high concentration of first impurity hinders oxygen from being trapped into the barrier layer in the growth thereof.

Preferably, the barrier layer contains oxygen with its concentration of $1 \times 10^{18}$ cm$^{-3}$ or less. The low concentration of oxygen assures high quality of the barrier layer.

Preferably, the light emission layer emits light having its wavelength of 220 to 360 nm. As emitting light in short wavelength UV region, the nitride semi-conductor light emitting device can be utilized as an UV LED to be a UV-light source alternative to a mercury lamp, excimer lamp, or the like.

The nitride semi-conductor light emitting device is preferably produced by steps of forming the p-type nitride semi-conductor layer, the n-type nitride semi-conductor layer, and the light emission layer between the p-type nitride semi-conductor layer and the n-type nitride semi-conductor layer, respectively within the chamber by metal organic vapor phase epitaxy (MOVPE). The forming steps are performed so as to develop within the light emission layer the AlGaInN quantum well structure including the well layer and the barrier layer, in which the barrier layer has a higher concentration of Al than the well layer. The process is characterized by supplying an impurity (preferably Si) and Al simultaneously into the chamber when growing at least the barrier layer in order to entrap oxygen with the impurity. The process enables to reduce the amount of oxygen combined with Al in the chamber of MOPVE apparatus, thereby improving quality of AlGaInN crystal as the light emission layer, so as to effectively supply the well layer with electrons for achieving a high internal quantum efficiency in the light emission layer.

MODE FOR CARRYING OUT THE INVENTION

Figure 1:
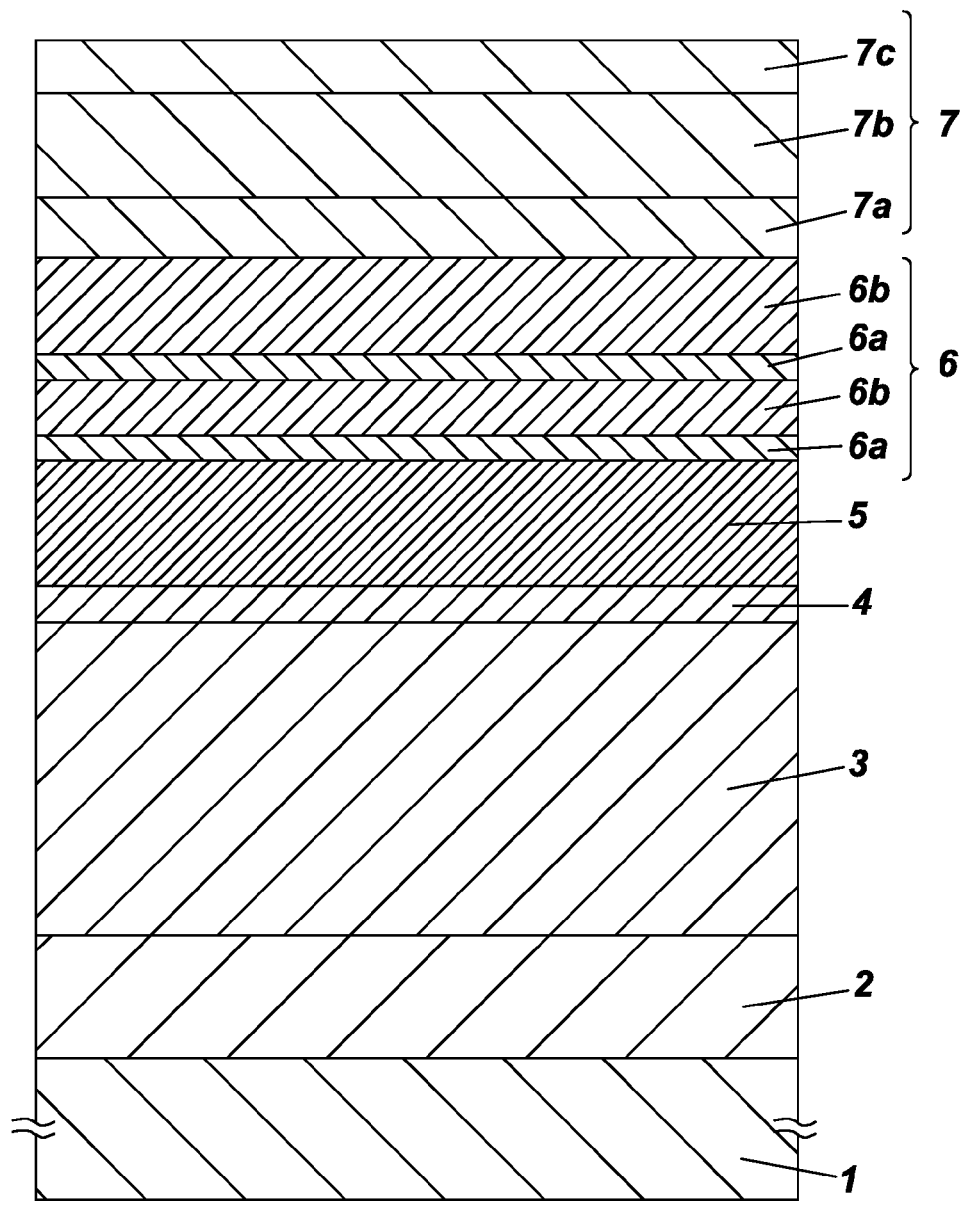
FIG. 1 shows a schematic sectional view of a nitride semi-conductor light emitting device in an embodiment.

A nitride semi-conductor light emitting device in this embodiment is a UV-LED and includes a single crystal substrate 1 for epitaxial growth, a first buffer layer 2, an n-type nitride semiconductor layer 3, a second buffer layer 4, a third buffer layer 5, a light emission layer 6, and a p-type nitride semi-conductor layer 7, which are superimposed in this order on the single crystal substrate 1, as shown in FIG. 1. A cathode (not shown) and an anode (not shown) are provided respectively on the n-type nitride semiconductor layer 3 and the p-type nitride semiconductor layer 7.

The single crystal substrate 1 is formed of a sapphire substrate with a (0001) surface (i.e., c-surface) serving as a mounting surface.

The first buffer layer 2 is formed of a single crystal of AlN layer having its thickness of 2.5 μm, acting to suppress threading dislocation and residual distortion of the n-type nitride semi-conductor layer 3. The thickness of first buffer 2 is not limited to 2.5 μm.

Prior to formation of the first buffer layer 2, the single crystal substrate 1 formed of sapphire substrate is set in a reaction chamber of MOVPE apparatus. Then, the single crystal substrate is heated up to a specific temperature (e.g., 1250° C.) for a predetermined time (e.g., 10 minutes) with interior of the reaction chamber being kept in a predetermined growth pressure (e.g., 10 kPa=76 Torr), for being made clean in its mounting surface. Subsequently, the reaction chamber is filled with trimethylaluminum (TMAl) as a source of Al in a predetermined amount (0.05 L/min (50 SCCM) under standard state) and NH$_3$ as a source of nitrogen in a predetermined amount (0.05 L/min (50 SCCM) under standard state) at the same time, in keeping substrate temperature in a predetermined temperature equal to the above specific temperature (i.e., 1250° C.), so as to grow the first buffer layer 2 made of AlN single crystal on the mounting surface of single crystal substrate 1. As a material of the first buffer layer 2, the present invention is not limited to the AlN single crystal, but may be AlGaN single crystal.

The n-type nitride semi-conductor layer 3 is formed of Si-doped n-type Al$_{0.55}$Ga$_{0.45}$N layer on the first buffer layer 2. The n-type nitride semi-conductor layer 3 is set to have its thickness of 2 μm in this embodiment, but the present invention is not limited to the thickness. The n-type nitride semi-conductor layer 3 is not limited to a single layer, but may be a multilayer which is formed of an Si-doped n-type Al$_{0.7}$Ga$_{0.3}$N layer and an Si-doped n-type Al$_{0.55}$Ga$_{0.45}$N layer formed on the Si-doped n-type Al$_{0.7}$Ga$_{0.3}$N layer, or the like.

In growth of the n-type nitride semi-conductor layer 3, the growth temperature is set at 1100° C., the growth pressure is set at a predetermined value (herein, 10 kPa). TMAl, trimethylgallium (TMGa), NH$_3$, and tetraethylsilane (TESi) are employed respectively as sources of Al, Ga, N, and Si which is provided as an impurity for exhibiting n-type electrical property. H$_2$ and N$_2$ gases are employed as carrier gases for carrying the materials. TESi is filled in a predetermined amount 0.0009 L/min (0.9 SCCM) under standard state. The present invention is not limited to these materials. For example, triethylgallium (TEGa), hydrazine derivatives, and monosilane (SiH$_4$) may be employed respectively as sources of Ga, N, and Si.

The second buffer layer 4 is provided to suppress threading dislocation and residual distortion of the light emission layer 6, and formed of AlGaInN layer having its thickness of 3 nm. Herein, the second buffer layer 4 is set to have its specific composition for achieving a desired band gap energy of 4.7 eV. The present invention is not limited to the band gap energy, but the second buffer layer 4 should be set not to absorb therein light which is emitted from the light emission layer 6. The present invention is not limited to the thickness of 3 nm for the second buffer layer 4.

In growth of the second buffer layer 4, the growth temperature is set at 800° C., the growth pressure is set at a predetermined value (herein, 10 kPa). TMAl, TMGa, trimethylindium (TMIn), and NH$_3$ are employed respectively as sources of Al, Ga, In, and N. N$_2$ gas is employed as a carrier gas for carrying the materials.

The third buffer layer 5 is formed of Si-doped n-type AlGaInN layer having its thickness of 18 nm, acting to suppress threading dislocation and residual distortion of the light emission layer 6. The third buffer layer 5 also acts to improve planarity of the light emission layer 6, and to relieve piezo electrical field of the light emission layer 6 by utilizing carriers generated in the third buffer layer. Namely, the third buffer layer 5 and the second buffer layer 4 are formed of same metal composition, and need to be formed so as to absorb thereinto the light which is emitted from the light emission layer 6. The third buffer layer 5 is set to have its thickness of 18 nm, but the present invention is not limited to the thickness.

In growth of the third buffer layer 5, the growth temperature is set at 800° C., the growth pressure is set at a predetermined value (herein, 10 kPa). TMAl, TMGa, TMIn, NH$_3$, and TESi are employed respectively as sources of Al, Ga, In, N, and Si. N$_2$ gas is employed as a carrier gas for carrying the materials. TESi is filled in a predetermined amount 0.0009 L/min (0.9 SCCM) under standard state, enabling to reduce the amount of oxygen to be entrapped into AlGaInN layer.

The light emission layer 6 is formed of an AlGaInN quantum well structure having two barrier layers 6b and two well layers 6a which are alternatively superimposed. In this embodiment, the light emission layer 6 is formed of a multi-quantum well structure, but may be formed of a single quantum well structure. In the light emission layer 6 of this embodiment, each of the well layers 6a is formed of AlGaInN layer having its thickness of 1.7 nm. The barrier layer 6b between two well layers 6a is formed of Si-doped AlGaInN layer having its thickness of 7 nm. The barrier layer 6b between the well layer 6a and the p-type nitride semi-conductor layer 8 is formed of Si-doped AlGaInN layer having its thickness of 14 nm (twice thickness of the barrier layer 6b between two well layers 6a). The present invention is not limited to these thicknesses of the well 6a and the barrier layers 6b. In the light emission layer 6 of this embodiment, Si is added as an impurity only to the barrier layer 6b, but may be added to both the barrier layer 6b and the well layer 6a. The barrier layer 6b is set to have its predetermined composition (Al$_a$Ga$_b$In$_{(1-a-b)}$, a≈0.6) for achieving a desired band gap energy of 4.7 eV. The well layer 6a is set to have its predetermined composition (Al$_c$Ga$_d$In$_{(1-c-d)}$, c≈0.35) for achieving a desired band gap energy of 4.4 eV. The present invention is not limited to the compositions of the barrier and well layers, but need to be set in accordance with a desired wavelength of light (e.g., 220 to 360 nm). The number of well layers 6a is not limited to two, but may be other. For example, the light emission layer 6 may be formed of a single quantum well including a single well layer 6a.

In growth of the light emission layer 6, the growth temperature is set at 800° C., the growth pressure is set at a predetermined value (herein, 10 kPa). TMAl, TMGa, TMIn, NH$_3$, and TESi are employed respectively as sources of Al, Ga, In, N, and Si. N$_2$ gas is employed as a carrier gas for carrying the materials. In growth of the light emission layer 6, each of supply rates of the materials needs to be controlled such that the well layer 6a and the barrier layer 6b have different composition of Group III metals. TMAl is supplied into the chamber by MOVPE in a predetermined amount of 0.008 L/min (8 SCCM) under standard state for growth of the barrier layer 6b, and in 0.001 L/min (1 SCCM) under standard state for growth of the well layer 6a. TESi is supplied into the chamber by MOVPE as a source of impurity of Si simultaneously with TMAl (a source of Al), in a predetermined amount of 0.0009 L/min (0.9 SCCM) under standard state only for growth of the barrier layer 6b, for reducing the amount of oxygen to be combined with Al and entrapped into the barrier layer 6b having high concentration of Al. The barrier layer 6b and the third buffer layer 5 have same metal composition, enabling to grow the lowest barrier layer 6b of the light emission layer 6 continuously after the growth of the third buffer layer 5.

The p-type nitride semi-conductor layer 7 includes a first p-type nitride semi-conductor layer 7a composed of Mg-doped p-type AlGaInN, a second p-type nitride semi-conductor layer 7b composed of Mg-doped p-type AlGaInN, and a third p-type nitride semi-conductor layer 7c composed of Mg-doped p-type In$_{0.03}$Ga$_{0.97}$N. The first p-type nitride semi-conductor layer 7a is formed on the light emission layer 6, and set to have its band gap energy larger than that of the second p-type nitride semi-conductor layer 7b by control of metal compositions of first and second p-type nitride semi-conductor layers 7a,7b. The second p-type nitride semi-conductor layer 7b is set to have the specific metal composition so as to achieve the same band gap as that of the barrier layer 6b. The first, second, and third p-type nitride semi-conductor layers 7a,7b,7c are respectively set to have their thicknesses of 15, 55, and 15 nm, but the present invention is not limited to the thicknesses.

In growth of the first, second, and third p-type nitride semi-conductor layers 7a,7b,7c, the growth temperature is set at 800° C., and the growth pressure is set at a predetermined value (herein, 10 kPa). TMAl, TMGa, TMIn, NH$_3$, and bis-cyclopentadienyl magnesium (Cp$_2$Mg) are employed respectively as sources of Al, Ga, In, N, and Mg. TMAl as a source of Al is supplied in growth of the first and second p-type nitride semi-conductor layers 7a,7b, while the supply of TMAl is stopped in growth of the third p-type nitride semi-conductor layer 7c. In growth of each p-type nitride semi-conductor layer, N$_2$ gas is employed as a carrier gas for carrying the materials, Cp$_2$Mg is supplied in 0.02 L/min (20 SCCM) under standard state. In growth of the first, second, and third p-type nitride semi-conductor layers 7a,7b,7c, each of supply rates of the materials needs to be controlled, in accordance with desired metal compositions thereof. The growth rate of first and second p-type nitride semi-conductor layers 7a,7b are set at 0.03 μm/h.

Figure 2:
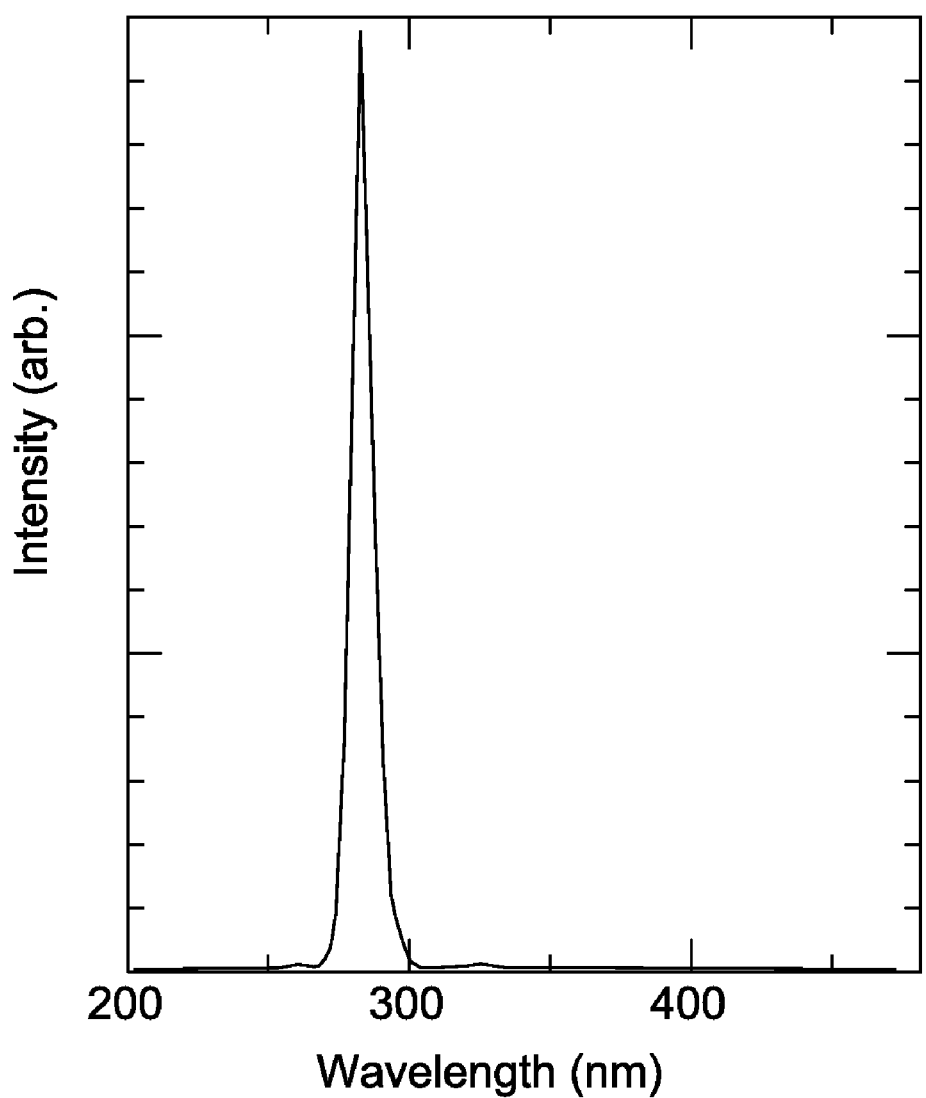
FIG. 2 shows a luminescent spectrum of an example of the above nitride semi-conductor light emitting device, in response to injection of electric current.
Figure 3:
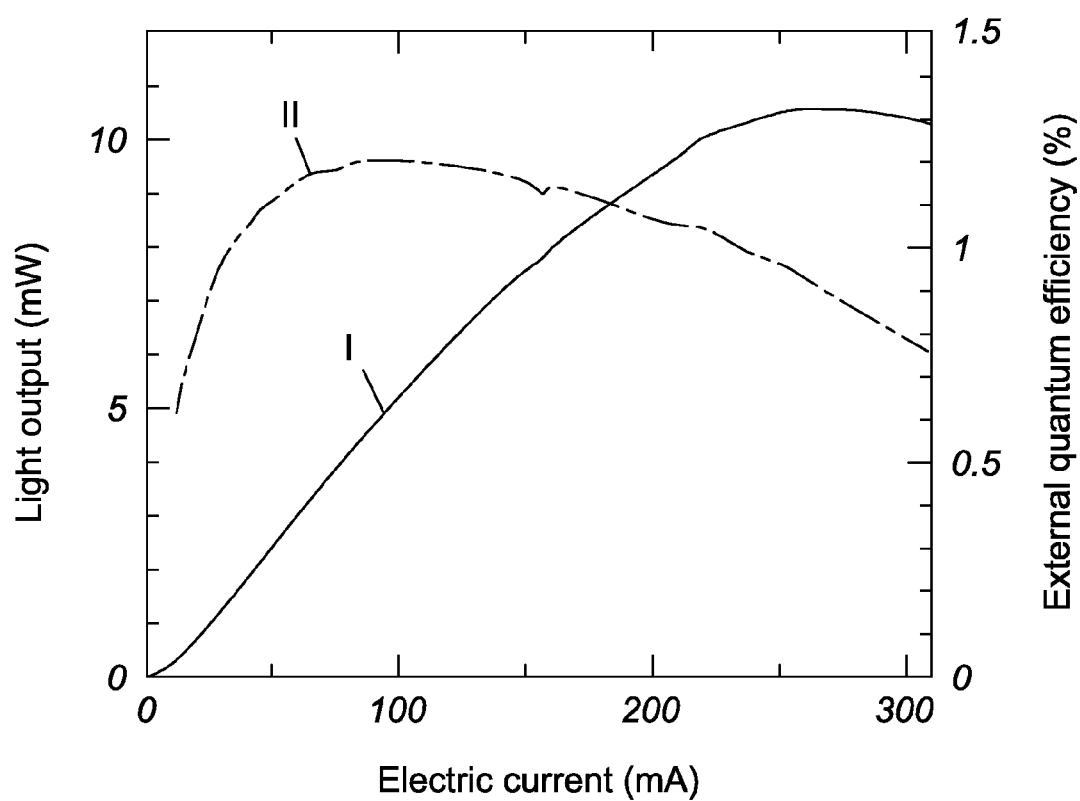
FIG. 3 shows variations of light output and external quantum efficiency in relation to the electric current, in the above example of the nitride semi-conductor light emitting device.

FIG. 2 shows a luminescent spectrum in response to injection of electric current, for the nitride semi-conductor light emitting device including the above layers 2 to 7 (referred to as an example). FIG. 3 shows variations of light output (solid line) and external quantum efficiency (broken line) in response to the injection of electric current in room temperature, which is measured for this example of the nitride semi-conductor light emitting device.

According to FIG. 2, nitride semi-conductor light emitting device in this example emits light having its peak at 280 nm in short wavelength UV region. In FIG. 3, the solid line (denoted by I) shows a relation between the electric current and the light output, and the light output has the maximum of 10.6 mW. The broken line (denoted by II) shows a relation between the electric current and the external quantum efficiency, and the external quantum efficiency has the maximum of 1.2%.

As a reference sample, sapphire substrate is formed thereon with an AlN layer, an Si-doped n-type AlGaN layer (denoted as AlGaN:Si in FIG. 4), a first Si-doped AlGaInN layer (AlGaInN:Si), a first AlGaN layer (AlGaN), a second Si-doped AlGaInN layer (AlGaInN:Si), a second AlGaN layer (AlGaN), which are superimposed in this order. The reference sample is utilized for examination of relation between O and Si concentrations to assure the effect in Si which is intentionally added as impurity in growth of AlGaInN layer. The first Si-doped AlGaN layer is interposed between the first and the second Si-doped AlGaInN layers, in order to distinguish an interface therebetween. The second AlGaN is formed as a capping layer on the second Si-doped AlGaInN layer, for the purpose of preventing oxygen in external air from being trapped into the second Si-doped AlGaInN layer, after the sample is taken from the reaction chamber of MOVPE. The growth conditions of the AlN layer and the Si-doped n-type AlGaN layer are identical to those of the first buffer layer 2 and the n-type nitride semi-conductor layer 3, and thus duplicate explanations are deemed unnecessary. The growth conditions of the first and second AlGaN layers are identical to that of the n-type nitride semi-conductor layer 3, except whether TESi is added or not. The growth condition of the first Si-doped AlGaInN layer is identical to that of the barrier layers 6b, in which the supply rate of TESi is set at 0.9 SCCM. The growth condition of the second Si-doped AlGaInN layer is identical to that of the barrier layers 6b except for the supply rate of TESi. In growth condition of the second Si-doped AlGaInN layer, the supply rate of TESi is set at 1.2 SCCM.

Figure 4:
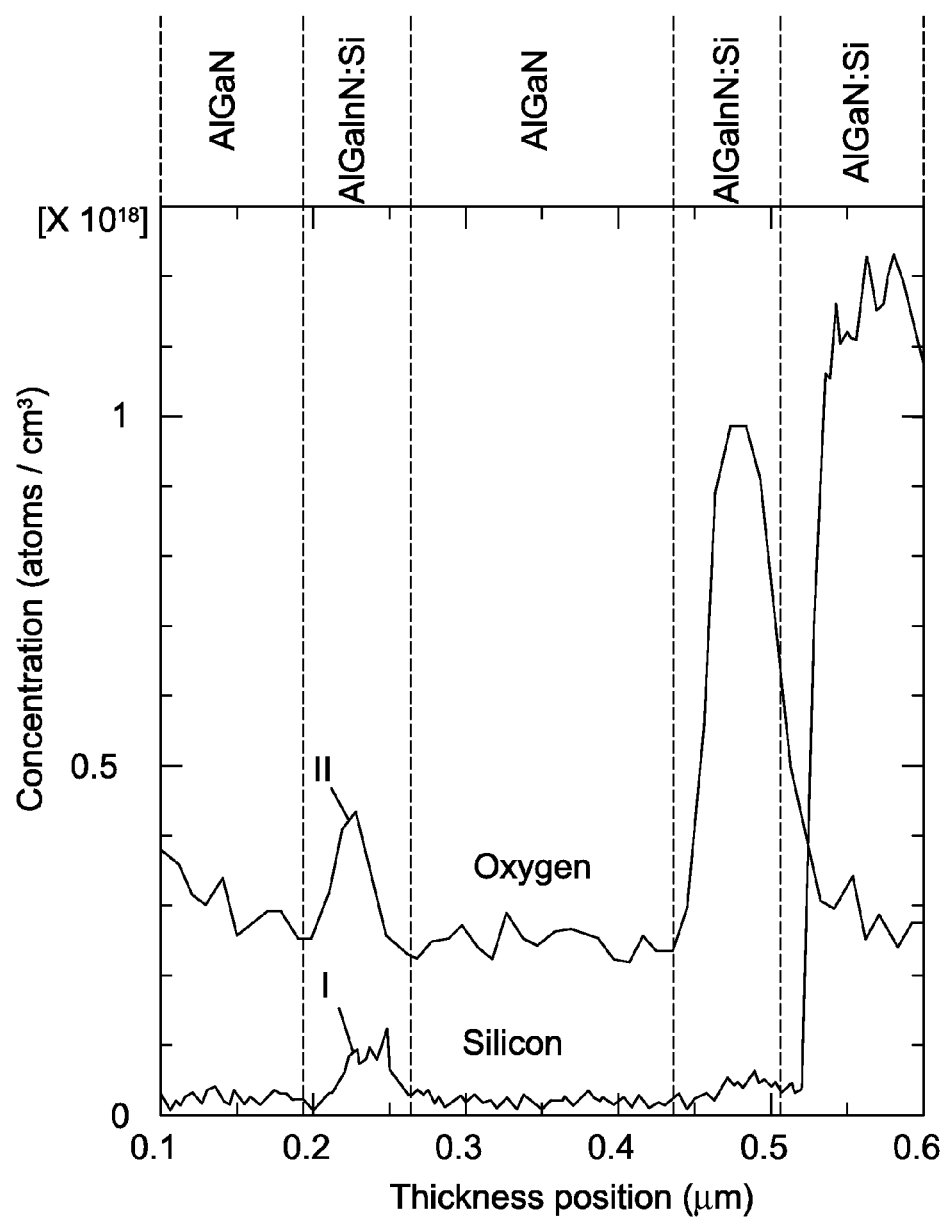
FIG. 4 shows a relation of concentration between Si and oxygen in a sample reference of the nitride semi-conductor light emitting device.

FIG. 4 shows variations in concentrations of Si (bold line denoted by I) and oxygen (thin line denoted by II), in relation to thickness position of the reference sample, which are measured by SIMS.

According to FIG. 4, concentration of Si is $5\times10^{16}$ cm$^{-3}$ in the first Si-doped AlGaInN layer, and $1\times10^{17}$ cm$^{-3}$ in the second Si-doped AlGaInN layer; while concentration of oxygen is $1\times10^{18}$ cm$^{-3}$ in the first Si-doped AlGaInN layer, and $4\times10^{17}$ cm$^{-3}$ in the second Si-doped AlGaInN layer. Accordingly, when being added as impurity in high concentration in growth of AlGaInN layer, Si enables to reduce the amount of oxygen entrapped into the AlGaInN layer. In both of the third buffer layer 5 and the barrier layer 6b, concentration of Si is set at $5\times10^{16}$ cm$^{-3}$, the amount of oxygen is reduced to $1\times10^{18}$ cm$^{-3}$. The third buffer layer 5 and the barrier layer 6b are preferably set to have Si concentration of $5\times10^{16}$ cm$^{-3}$ or more, for reducing the amount of oxygen down to $1\times10^{18}$ cm$^{-3}$ or less. In the present invention, the amount of oxygen entrapped into the AlGaInN layer can be regulated only by control of the concentration of Si, enabling to easily provide the third buffer layer 5 and the barrier layer 6b with low defect and high quality.

In this embodiment, the light emission layer 6 is formed of AlGaInN, and has higher concentrations of both Si and Al in the barrier layer 6b than the well layer 6a. The third buffer layer 5 has higher concentration of Al than the well layer 6a. In this embodiment, Si and Al are simultaneously supplied into the chamber to grow the third buffer layer 5 and the light emission layer 6 (especially the barrier layer 6b) by MOVPE, in consideration of high concentration of Al which is easily bonded to oxygen. It enables to entrap oxygen with Si, reducing the amount of oxygen bonded to Al, thereby providing the barrier layer 6b and the third buffer layer 5 with high quality.

Namely, In the light emission layer 6 of the above nitride semi-conductor light emitting device, the barrier layer 6b is formed of $Al_aGa_bIn_{(1-a-b)}N$ (0<a<1, 0<b<1, 1−a−b>0) and contains a first impurity (i.e., Si in this embodiment) at a concentration of A (e.g., $5 \times 10^{16}$ cm$^{-3}$) greater than zero; the well layer 6a is formed of $Al_cGa_dIn_{(1-c-d)}N$ (0<c<1, c<a, 0<d<1, 1−c−d>0) and contains a second impurity (i.e., Si in this embodiment) at a concentration of B (0 cm$^{-3}$ in this embodiment) which is equal to or greater than zero and less than A. With the high concentration of Si in the barrier layer, oxygen is entrapped with the impurity (i.e., Si), reducing the amount of oxygen combined with Al.

In the nitride semi-conductor light emitting device of this embodiment, the barrier layer 6b has a concentration of oxygen lower than that of well layer 6a, even though containing higher concentration of Al than the well layer 6a. With the low concentration of oxygen, the light emission layer 6 in this embodiment can be formed of AlGaInN with high quality, preventing electron trap due to defects derived from oxygen, thereby efficiently supplying electrons into the well layer 6a to achieve high internal quantum efficiency.

With the use of Si as the first and second impurities in this embodiment, large amount of oxygen is bonded to Si, rather than Al, in reaction chamber of MOPVE apparatus. It enables to reduce a concentration of oxygen in the light emission layer, especially in the barrier layer. Besides, it is unnecessary to additionally equip MOVPE apparatus with any pipes in growth of the third buffer layer 5 and the barrier layer 6b, when Si is supplied also into the n-type nitride semi-conductor layer 3 as a donor impurity, for simplifying the apparatus and reducing a manufacturing cost.

The nitride semi-conductor light emitting device in this embodiment includes the light emission layer 6 which is set to emit a light having its wavelength of 220 to 360 nm in short wavelength UV region, and is possibly utilized as an UV LED alternative to a mercury lamp, excimer lamp, or the like.

It is noted that many widely different embodiments may be made in accordance with the technical concept of the present invention, and therefore the present invention should not be limited to the specific embodiments except as defined in the claims.

In this embodiment, the nitride semi-conductor light emitting device is produced by MOVPE method, but may be made by Hydride Vapor Phase Epitaxy (HVPE) or Molecular Beam Epitaxy (MBE) method.

The single crystal substrate 1 is formed of sapphire substrate in this embodiment, but may be made of spinel substrate, silicon substrate, silicone carbonate substrate, zinc oxide substrate, gallium-phosphorus substrate, gallium-arsenic substrate, magnesium oxide substrate, zirconium-boron substrate, or group III nitride semi-conductor crystal substrate.

The invention claimed is:

1. A nitride semi-conductor light emitting device comprising;
   a p-type nitride semi-conductor layer,
   an n-type nitride semi-conductor layer; and
   a light emission layer which is interposed between said p-type nitride semi-conductor layer and said n-type nitride semi-conductor layer, said light emission layer having a quantum well structure with a barrier layer and a well layer;
   said barrier layer being formed of $Al_aGa_bIn_{(1-a-b)}N$ whose Al component is equal to or more than 60% (0.6≦a<1, 0<b<0.4, 1−a−b>0), and containing a first impurity at a concentration of A greater than zero;
   said well layer being formed of $Al_cGa_dIn_{(1-c-d)}N$ whose Al component is equal to or more than 35% (0.35≦c<1, c<a, 0<d<0.65, 1−c−d>0), and containing a second impurity at a concentration of B equal to or greater than zero;
   wherein said concentration of A is larger than that of B, in order that said barrier layer has a concentration of oxygen smaller than that in said well layer.

2. The nitride semi-conductor light emitting device as set forth in claim 1, wherein
   said first and second impurities are Si.

3. The nitride semi-conductor light emitting device as set forth in claim 2, wherein said concentration of A is $5 \times 10^{16}$ cm$^{-3}$ or more.

4. The nitride semi-conductor light emitting device as set forth in claim 3, wherein
   said barrier layer has a concentration of oxygen of $1 \times 10^{18}$ cm$^{-3}$ or less.

5. The nitride semi-conductor light emitting device as set forth in claim 2, wherein
   said barrier layer has a concentration of oxygen of $1 \times 10^{18}$ cm$^{-3}$ or less.

6. The nitride semi-conductor light emitting device as set forth in claim 1, wherein
   said barrier layer has a concentration of oxygen of $1 \times 10^{18}$ cm$^{-3}$ or less.

7. The nitride semi-conductor light emitting device as set forth in claim 1, wherein
   said light emission layer emits light having its wavelength of 220 to 360 nm.

8. A process of producing a nitride semi-conductor light emitting device, said process comprising steps of forming
   a p-type nitride semi-conductor layer
   an n-type nitride semi-conductor layer,
   a light emission layer between said p-type nitride semi-conductor layer and said n-type nitride semi-conductor layer, respectively within a chamber by metal organic vapor phase epitaxy (MOVPE) in order to develop within said light emission layer an AlGaInN quantum well structure including a well layer formed of $Al_cGa_dIn_{(1-c-d)}N$ whose Al component is equal to or more than 35% (0.35≦c<1, 0<d<0.65, 1−c−d>0) and a barrier layer formed of $Al_aGa_bIn_{(1-a-b)}N$ whose Al component is equal to or more than 60% (0.6≦a<1, 0<b<0.4, 1−a−b>0) with said barrier layer having a higher concentration of Al than said well layer (c<a);
   wherein said process is characterized by supplying an impurity and Al simultaneously into said chamber when growing at least said barrier layer in order to entrap oxygen with said impurity, thereby reducing the amount of oxygen combined with Al.

9. The process of producing nitride semi-conductor light emitting device as set forth in claim 8, wherein said impurity is Si.

* * * * *